(12) United States Patent
Lemke

(10) Patent No.: US 7,927,149 B2
(45) Date of Patent: Apr. 19, 2011

(54) INTERCONNECTION ASSEMBLY FOR PRINTED CIRCUIT BOARDS

(75) Inventor: Timothy A. Lemke, Dillsburg, PA (US)

(73) Assignee: Z-Plane, Inc., Palo Alto, CA (US)

( * ) Notice: Subject to any disclaimer, the term of this patent is extended or adjusted under 35 U.S.C. 154(b) by 0 days.

(21) Appl. No.: 12/646,817

(22) Filed: Dec. 23, 2009

(65) Prior Publication Data

US 2010/0099306 A1 Apr. 22, 2010

Related U.S. Application Data

(63) Continuation of application No. 12/288,209, filed on Oct. 17, 2008, now Pat. No. 7,654,870.

(60) Provisional application No. 61/065,136, filed on Feb. 11, 2008, now Pat. No. 7,654,870.

(51) Int. Cl.
*H01R 24/00* (2011.01)

(52) U.S. Cl. ........................................ 439/636

(58) Field of Classification Search .............. 439/108, 439/101, 607.11, 607.05, 636, 65–68, 74
See application file for complete search history.

(56) References Cited

U.S. PATENT DOCUMENTS

| 6,163,464 A | 12/2000 | Ishibashi et al. |
| 6,976,886 B2 * | 12/2005 | Winings et al. ............... 439/701 |
| 2007/0124930 A1 | 6/2007 | Cheng et al. |

FOREIGN PATENT DOCUMENTS

WO WO 03/092121 A2 11/2003

OTHER PUBLICATIONS

PCT, International Search Report, mailed Mar. 20, 2009, for related international application No. PCT/US2009/000748.
PCT, International Search Report, mailed Apr. 9, 2009, for related international application No. PCT/US2009/000751.

* cited by examiner

*Primary Examiner* — Javaid Nasri
(74) *Attorney, Agent, or Firm* — Jones Day

(57) ABSTRACT

An apparatus electrically interconnects pins that project from the rear side of a backplane in separate arrays corresponding to respective circuit boards at the front side of the backplane. The apparatus comprises a connector board assembly extending across the rear side of the backplane between separate arrays of pins. The connector board assembly has signal routing circuitry that electrically interconnects those separate arrays of pins. This enables the respective printed circuit boards to be electrically interconnected independently of any signal routing circuitry within the structure of the backplane. Accordingly, the apparatus preferably includes a backplane that is free of signal routing circuitry for interconnecting pins that extend through the backplane.

23 Claims, 12 Drawing Sheets

INTERCONNECTION ASSEMBLY FOR PRINTED CIRCUIT BOARDS

RELATED APPLICATIONS

This application is a continuation of U.S. application Ser. No. 12/288,209, filed Oct. 17, 2008, now U.S. Pat. No. 7,654,870 which claims the benefit of provisional U.S. patent application Ser. No. 61/065,136, filed Feb. 11, 2008, now U.S. Pat. No. 7,654,870.

TECHNICAL FIELD

This technology relates to electrical connections between printed circuit boards installed against a backplane.

BACKGROUND

Printed circuit boards are typically interconnected through a backplane. The backplane may be located at the rear of a cabinet or other housing. The circuit boards are installed in the housing by sliding them into positions that are parallel to each other and perpendicular to the backplane, with their inner edges adjoining the backplane. Electrical connections for routing signals between the boards are formed in part by connectors that attach them to the backplane, and in part by circuitry within the backplane itself. The configuration of that circuitry is constrained by the area and thickness of the backplane. As a result, close proximity of interconnecting traces within the backplane can cause problems such as signal attenuation, signal reflection, crosstalk and noise. This can be resolved by increasing the size of the backplane to decrease the circuit density. However, signal loss is directly proportional to the square of the signal length, so the signal loss caused by longer traces can cancel out some, if not all, of the benefits gained by decreasing the density.

SUMMARY

An apparatus electrically interconnects conductors arranged at the rear side of a backplane in separate arrays corresponding to respective circuit boards at the front side of the backplane. The apparatus comprises a connector board assembly extending across the rear side of the backplane between separate arrays of conductors. The connector board assembly has signal routing circuitry that electrically interconnects those separate arrays of conductors. This enables the respective printed circuit boards to be electrically interconnected independently of any signal routing circuitry within the structure of the backplane. Accordingly, the apparatus preferably includes a backplane that is free of signal routing circuitry for interconnecting conductors that extend through the backplane.

In a given example, the conductors are pins, and the connector board assembly includes a connector board and a pair of adapters. Each adapter has electrical terminals with inner and outer end portions. The inner end portions of the terminals on each adapter are arranged along a straight line to engage a corresponding row of pins projecting from the rear side of the backplane. The outer end portions of the terminals on each adapter are arranged along a skewed line at an acute angle to the straight line. The connector board interconnects the outer end portions of the electrical terminals on the adapters when the board is installed at the rear side of the backplane in a position bridging the adapters along the skewed lines. The connector board and the adapters can thus form diagonal electrical connections between orthogonal arrays of pins at the rear side of the backplane.

DETAILED DESCRIPTION

Figure 1:
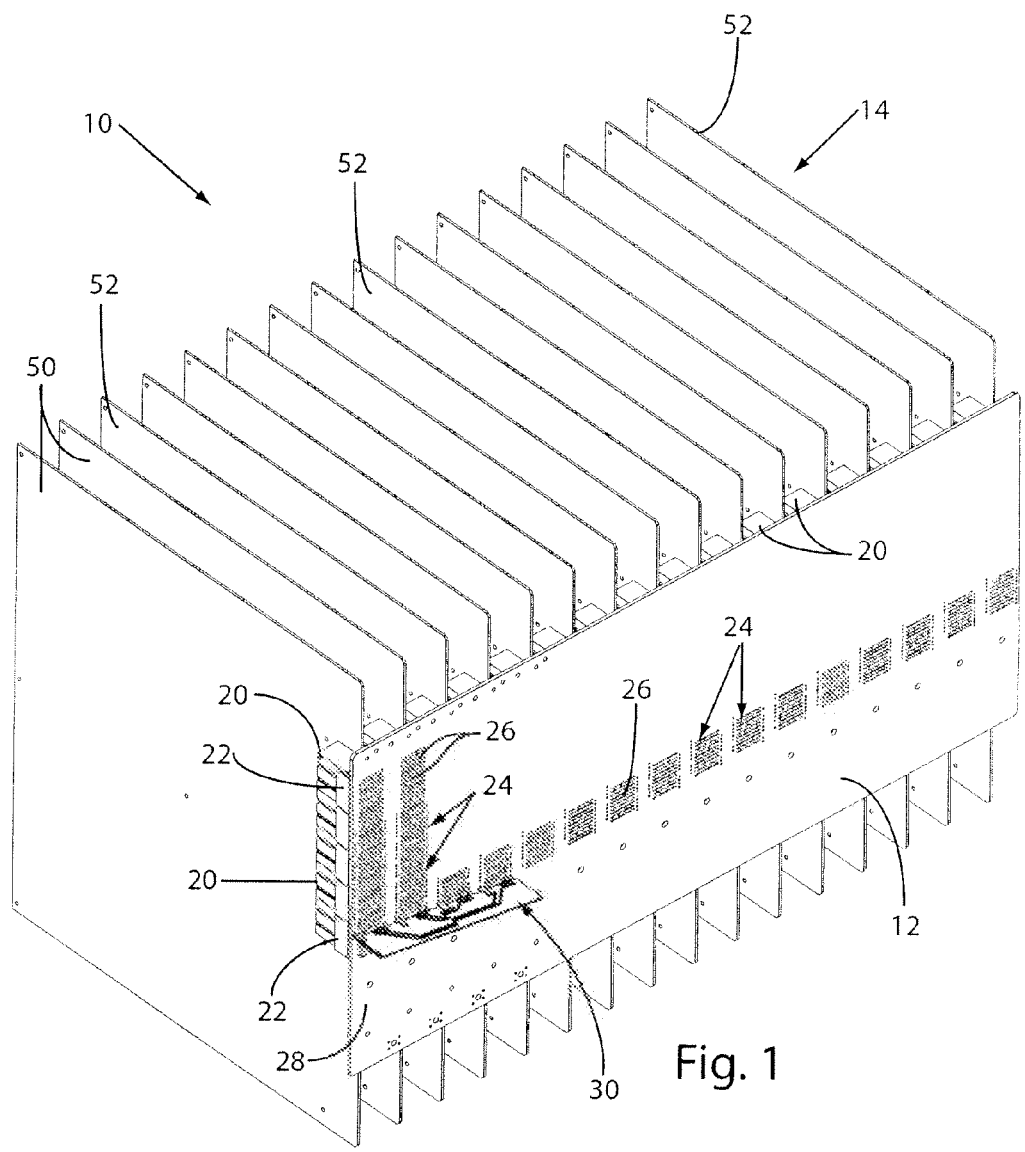
FIG. 1 is a rear perspective view of parts of a backplane assembly.

The apparatus shown in the drawings has parts that are examples of the elements recited in the claims. The following description thus includes examples of how a person of ordinary skill in the art can make and use the claimed invention. It is presented here to meet the statutory requirements of written description, enablement, and best mode without imposing limitations that are not recited in the claims.

Figure 2:
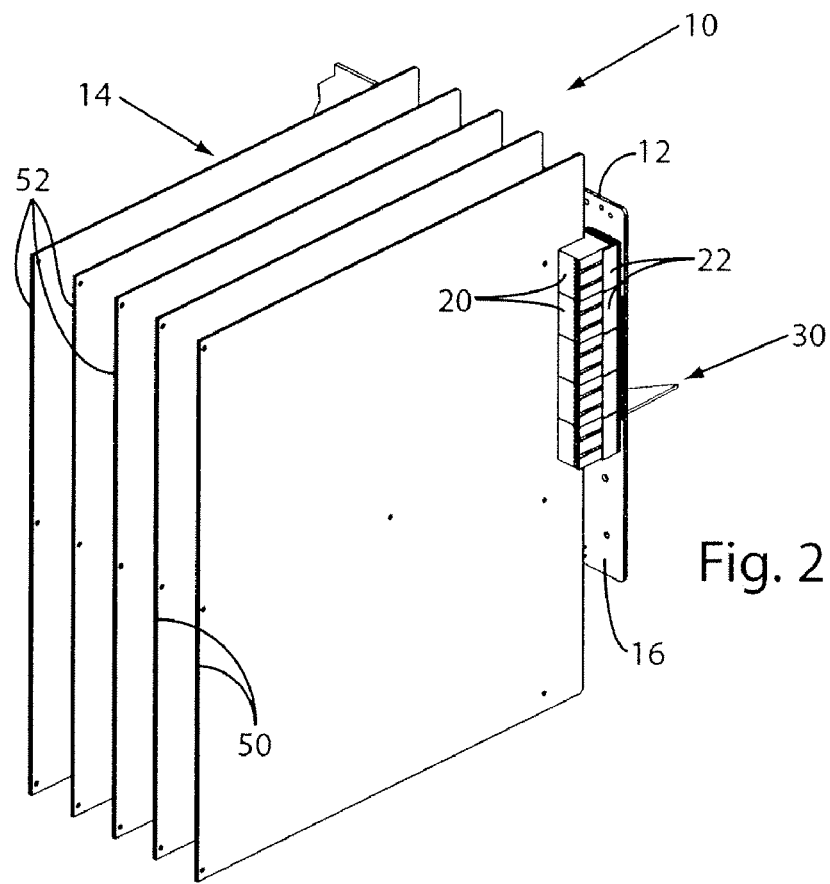
FIG. 2 is a rear perspective view of parts shown in FIG. 1.

FIGS. 1 and 2 show parts of a backplane assembly 10, including a backplane 12 and printed circuit boards configured as cards 14 arranged along the front side 16 of the backplane 12. Each card 14 has connectors 20 engaged with corresponding headers 22 that are mounted on the backplane 12. Each header 22 has an array 24 of conductors in the form of pins 26. The pins 26 at each header 22 extend from the corresponding connector 20 through the backplane 12 to project from the rear side 28 of the backplane 12. A plurality of connector board assemblies 30, one of which is shown in FIG. 1, extend across the rear side 28 of the backplane 12 between separate arrays 24 of pins 26. The connector board assemblies 30 have circuitry that interconnects the separate arrays 24 of pins 26. This enables cards 14 at the front side 16 of the backplane 12 to be electrically interconnected independently of the backplane 12, and thereby avoids problems that might otherwise be caused by circuit density within the structure of the backplane 12.

Figure 3:
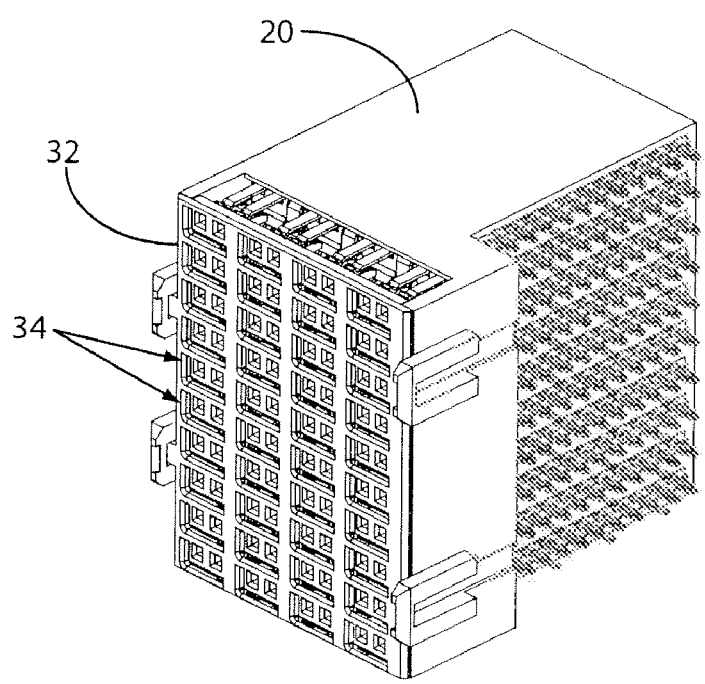
FIG. 3 is a rear perspective view of a part of the backplane assembly.
Figure 4:
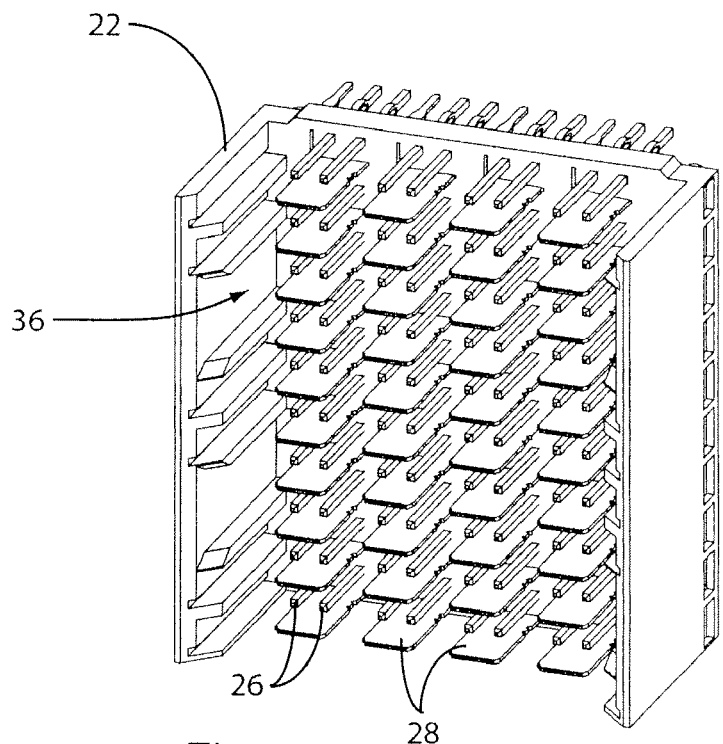
FIG. 4 is a front perspective view of a part of the backplane assembly.
Figure 5:
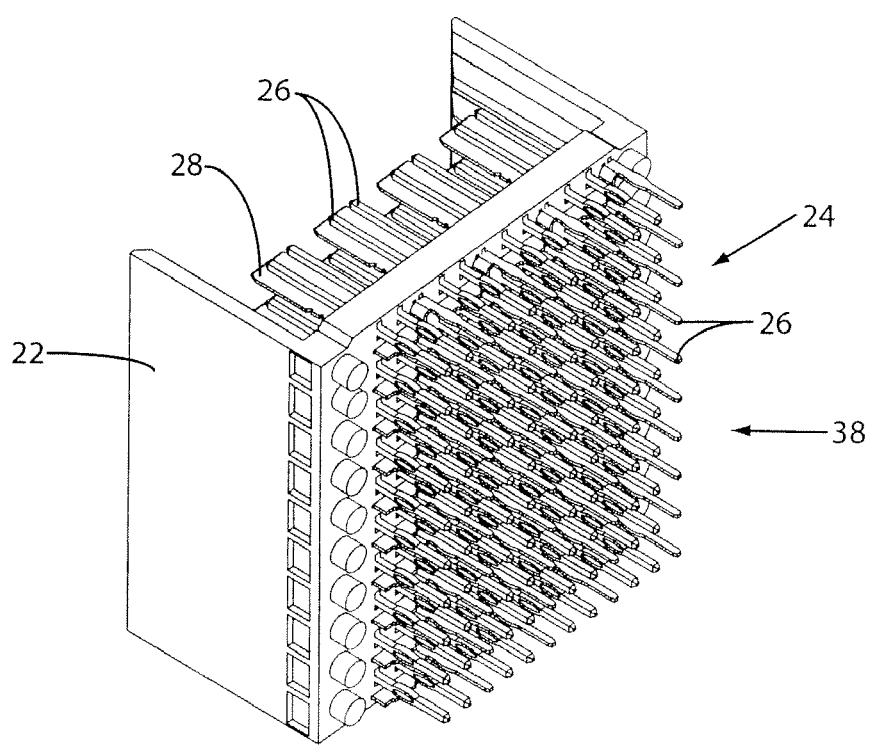
FIG. 5 is a front perspective view of the part shown in FIG. 4.

As shown in FIG. 3, each connector 20 has a rear end 32 with receptacles 34. As shown in FIG. 4, each header 22 has a front side 36 from which the pins 26, as well as an array of blades 28, project into the receptacles 34 in the corresponding connector 20. Each header 22 has a rear side 38 (FIG. 5) from which the pins 26 project through the backplane 12. The orthogonal array 24 in the illustrated example includes ten rows of twelve pins 26.

Figure 6:
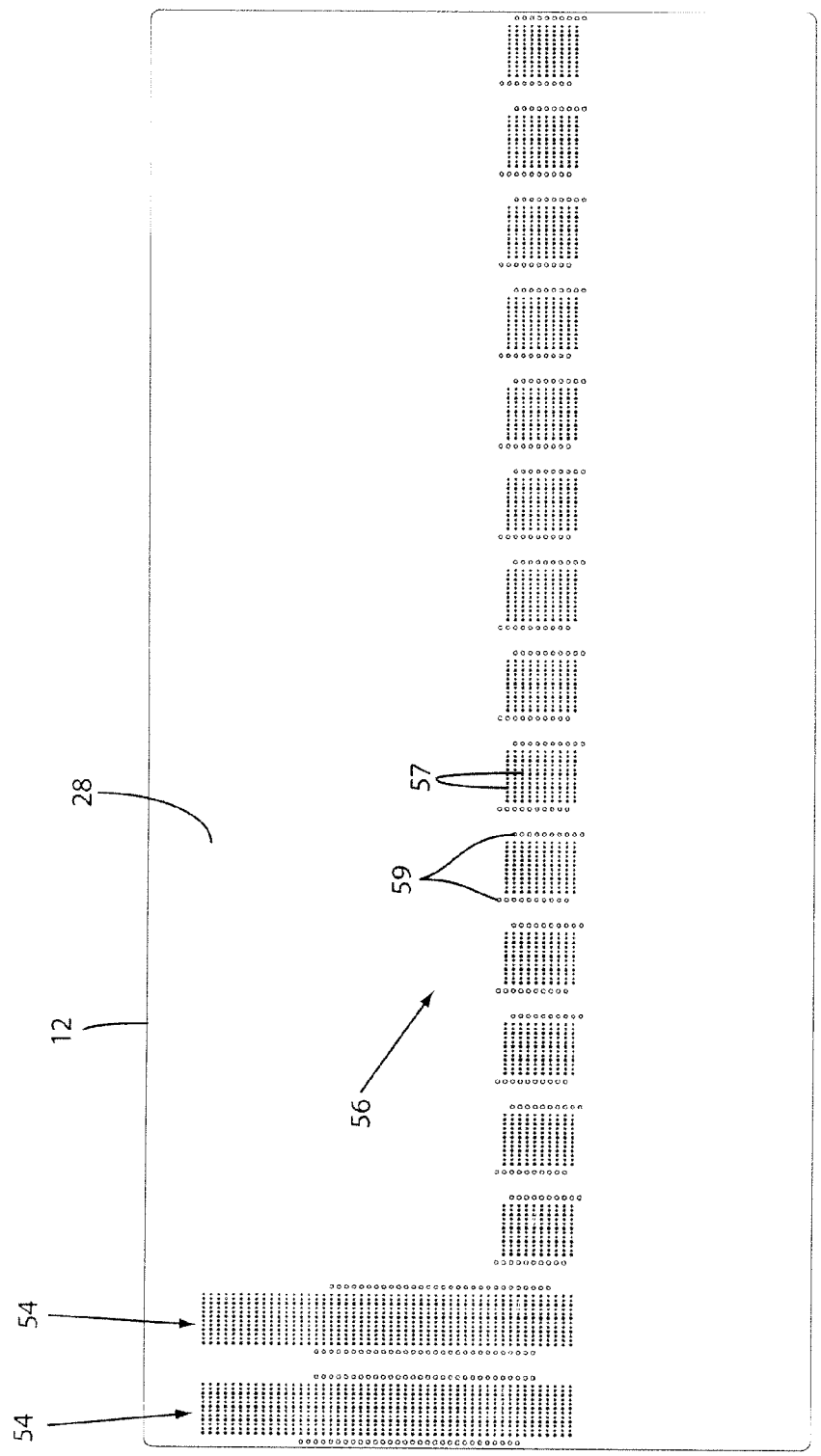
FIG. 6 is a rear view of a part of the backplane assembly.

The cards 14 in this example include a pair of hub cards 50 and a larger series of daughter cards 52. Each hub card 50 has multiple connectors 20 engaging corresponding headers 22 on the backplane 12. The arrays 24 of pins 26 projecting from those headers 22 form two vertical columns at the rear side 28 of the backplane 12. Each daughter card 52 may also have multiple connectors 20, as shown in FIGS. 1 and 2. However, the backplane assembly 10 includes only a single header 22 for each daughter card 52. The arrays 24 of pins 26 projecting from those headers 22 form a single horizontal row across the rear side 28 of the backplane 12. As shown in FIG. 6, the backplane 12 in this example is configured for that particular arrangement, with two columns 54 and one row 56 of holes 57 for receiving the pins 26.

More specifically, the pin holes 57 in each column 54 are arranged in an orthogonal array that encompasses the multiple arrays 24 of pins 26 on the headers 22 for the corresponding hub card 50. The pin holes 57 in the horizontal row 56 are likewise arranged in orthogonal arrays, each of which matches the orthogonal array 24 of pins 26 on the header 22 at the corresponding daughter card 52. Accordingly, each array of pin holes 57 in the horizontal row 56 includes ten rows of twelve holes 57. Columns of peg holes 59 for the connector board assemblies 30 (FIG. 1) are arranged in pairs that flank the arrays of pin holes 57. The backplane 12 preferably does not include signal traces that interconnect any pin hole 57 with any other pin hole 57.

Figure 7:
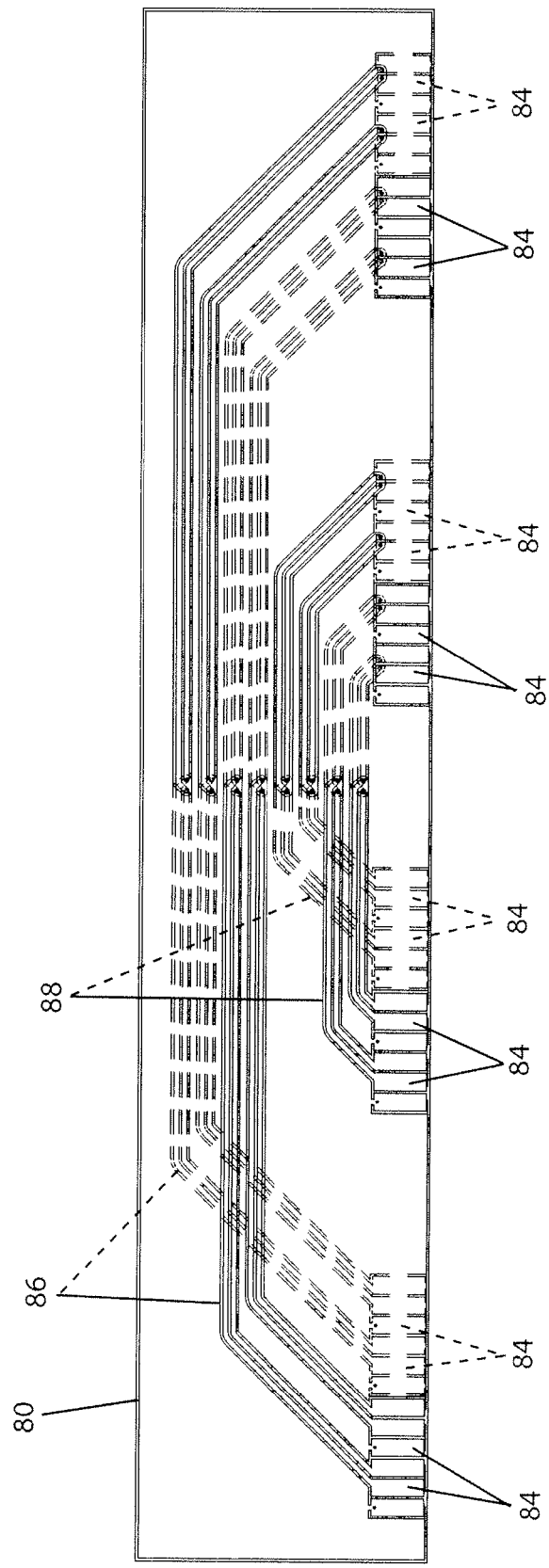
FIG. 7 is a top view of a part of the backplane assembly.
Figure 8:
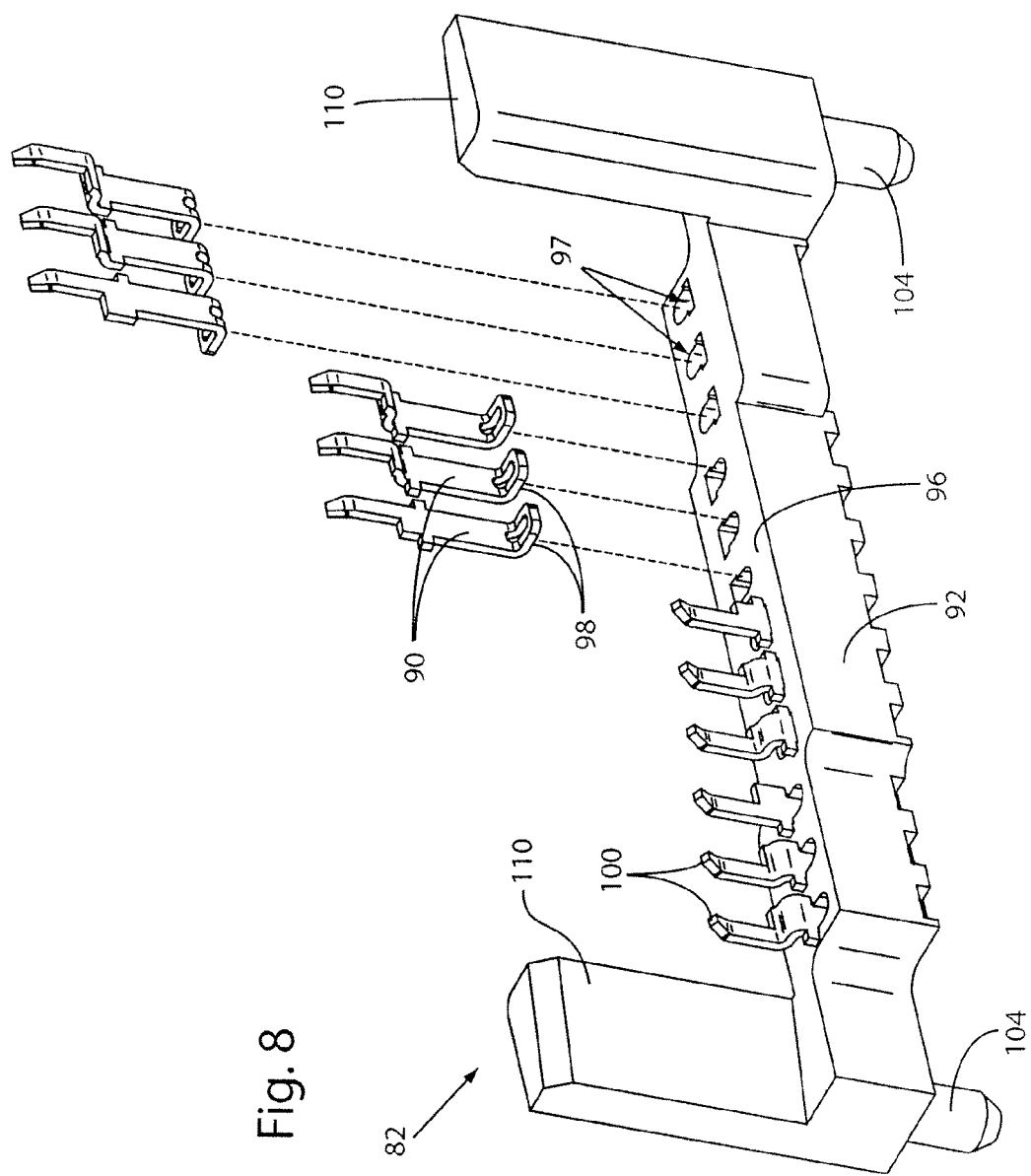
FIG. 8 is a perspective view of a part of the backplane assembly.
Figure 9:
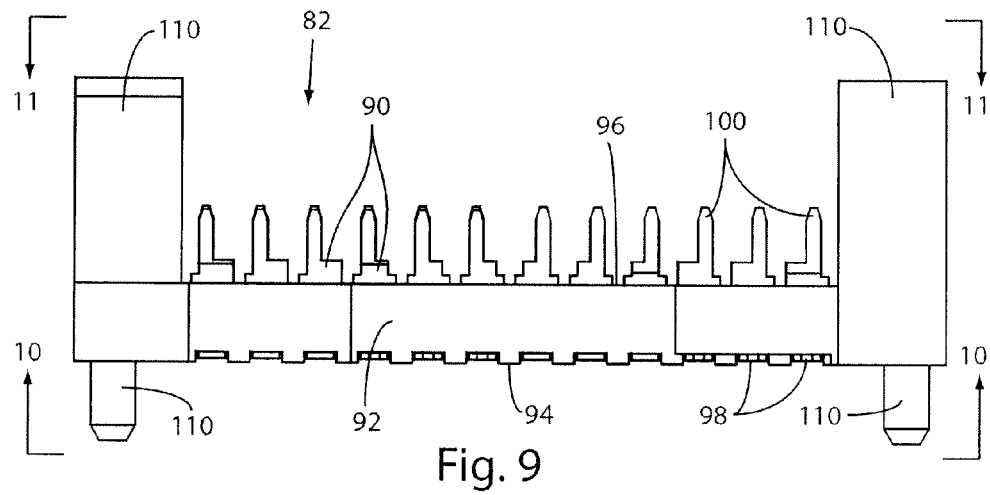
FIG. 9 is a top view of the part shown in FIG. 8.

The individual connector board assembly 30 of FIG. 1 includes a connector board and two pairs of adapters. As shown separately in FIG. 7, the connector board 80 is an elongated rectangular panel with four sets of electrical contacts 84 arranged along one long edge. Each set includes twelve contacts 84, with six of those contacts 84 on one side of the board 80 and the other six on the opposite side of the board 80. The structure of the board 80 includes signal traces 86 that interconnect the two sets of contacts 84 at the opposite ends of the board 80, as well as signal traces 88 that interconnect the two intermediate sets of contacts 84.

Figure 10:
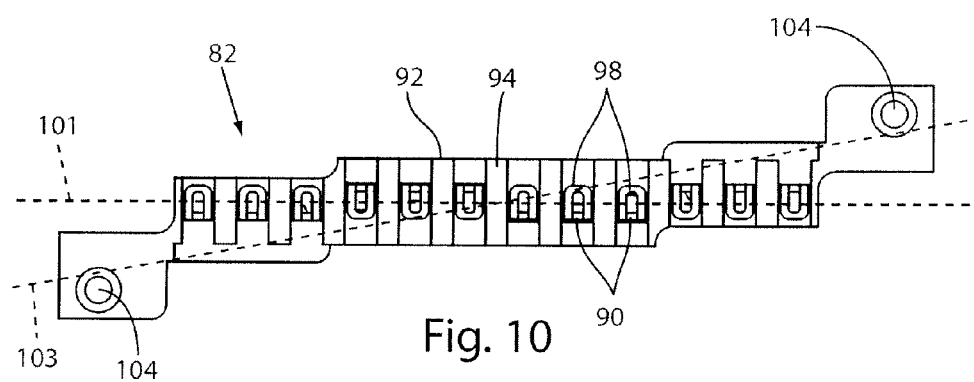
FIG. 10 is a view taken on line 10-10 of FIG. 9.
Figure 11:
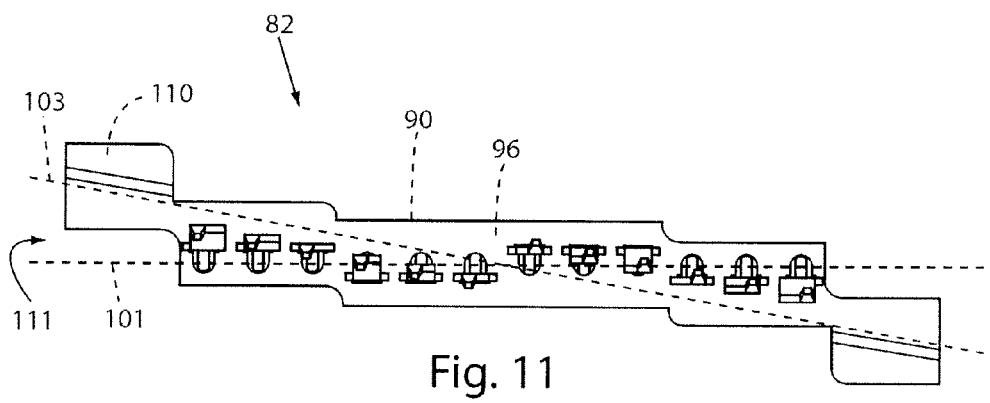
FIG. 11 is a view taken on line 11-11 of FIG. 9.

The adapters 82 are alike. As shown in FIGS. 8-11, each adapter 82 in the given example includes twelve electrical terminals 90 and a housing 92 for the terminals 90. The housing 92 is an elongated structure with front and rear sides 94 and 96. Passages 97 extend through the housing 92, and are arranged in a row along the length of the housing 92. The terminals 90 are installed in the passages 97, with their inner end portions 98 accessible at the front side 94 of the housing 92, and their outer end portions 100 accessible at the rear side 96. The inner end portions 98 of the terminals are arranged along a first straight line 101 (FIG. 10). The outer end portions 100 are arranged in parallel rows of six that are equally spaced laterally across a second straight line 103 (FIG. 11). The second straight line 103 lies in a plane parallel to the plane of the first straight line 101, but is skewed at an acute angle to the first straight line 101.

Figure 12:
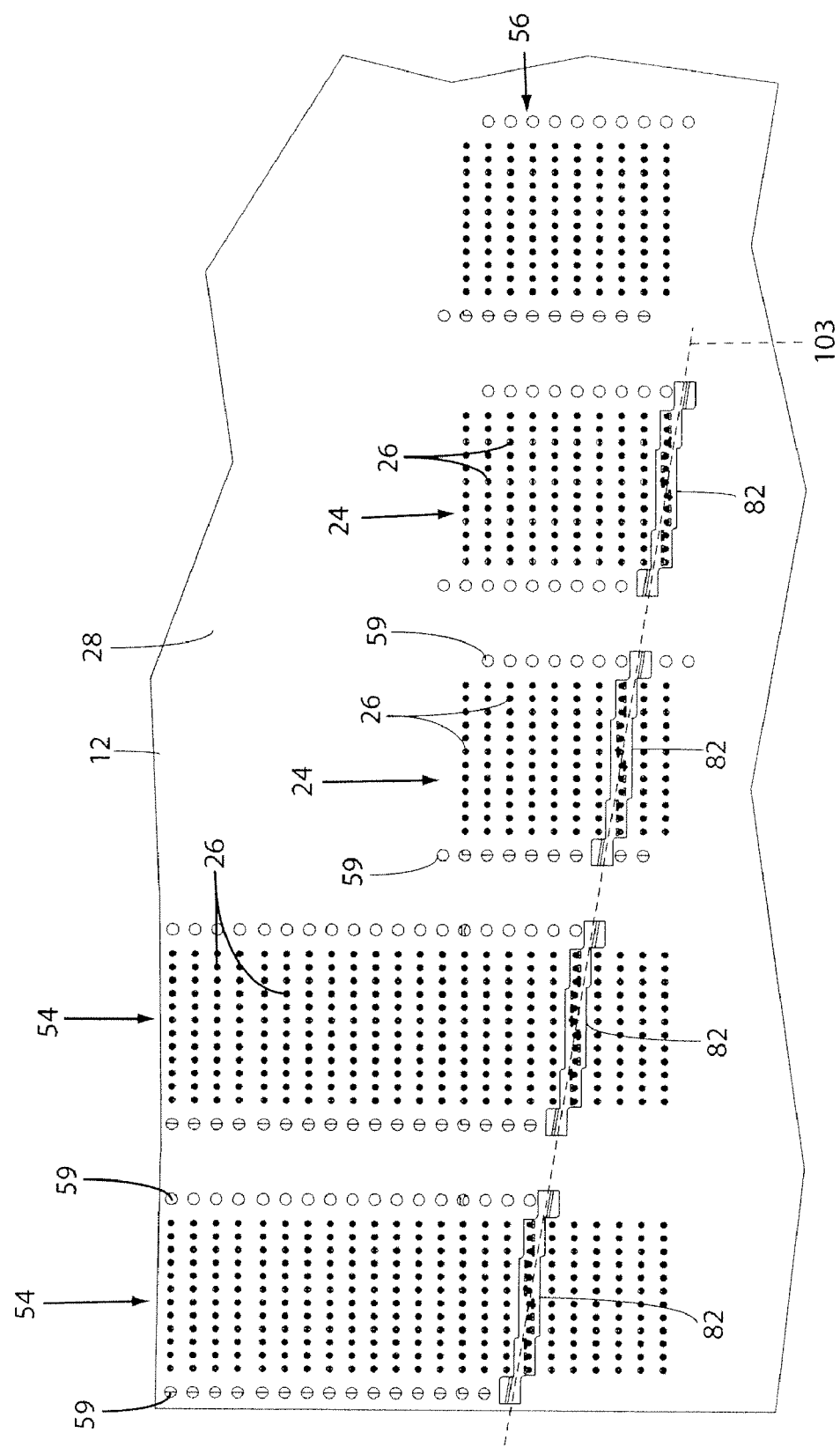
FIG. 12 is an enlarged partial view of parts of the backplane assembly.

Pegs 104 project from the housing 92 at opposite ends of the front side 94. The pegs 104 are receivable in peg holes 59 in the backplane 12 to support the adapter 82 in an installed position at the rear side 28 of the backplane 12. When in the installed position, the inner end portions 98 of the terminals 90 engage a row of pins 26 projecting from a row of pin holes 57 in the backplane 12. Accordingly, as shown in FIG. 12, the four adapters 82 can be installed on the rear side of the backplane 12 separately from each other, but with their skewed lines 103 extending together across multiple arrays 24 of pins 26. The inner end portions 98 of the terminals 90 then engage four diagonally offset rows of pins 26 corresponding to four different cards 14 at the front side 16 of the backplane 12.

Figure 13:
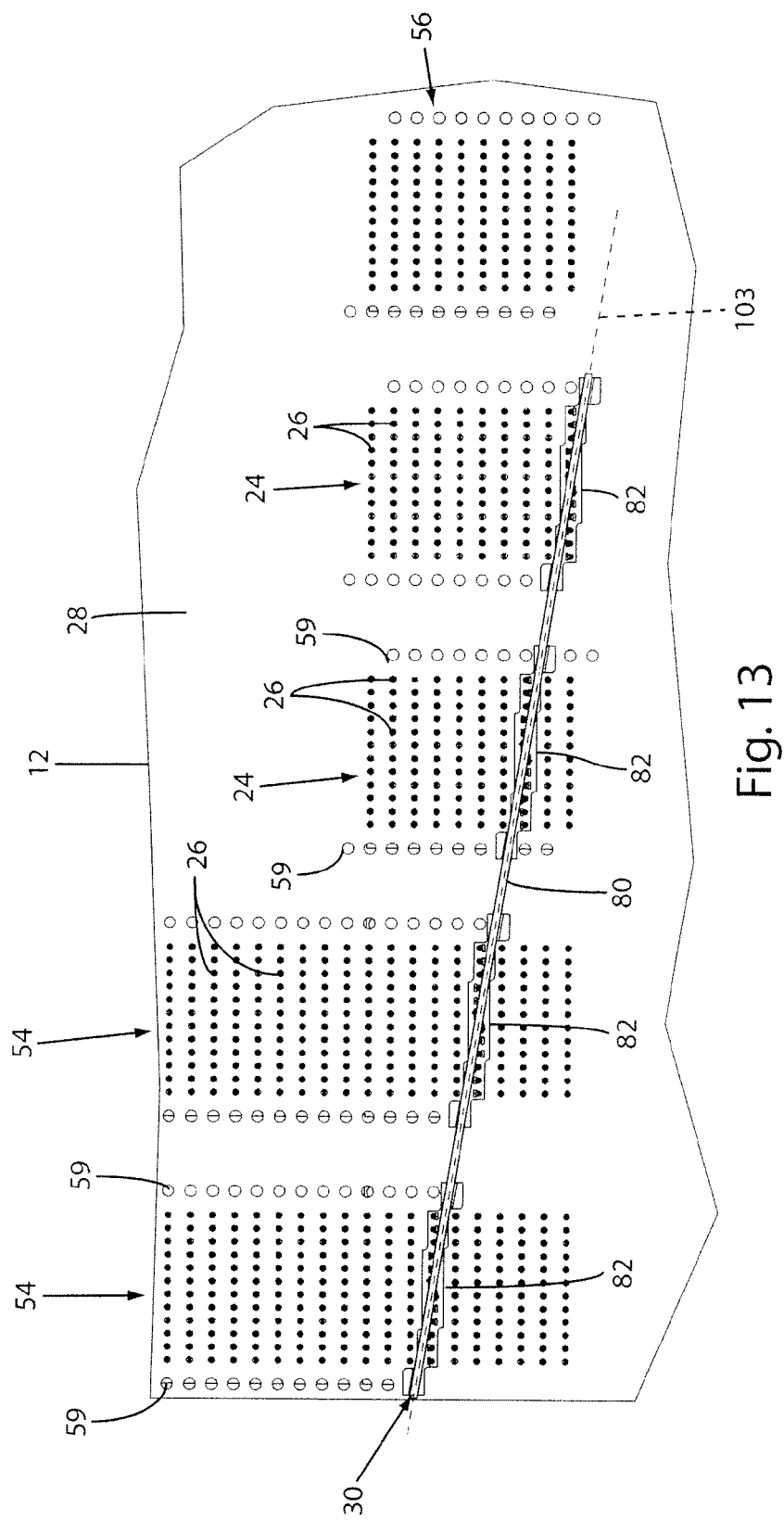
FIG. 13 is a view similar to FIG. 12, showing another part of the backplane assembly.
Figure 14:
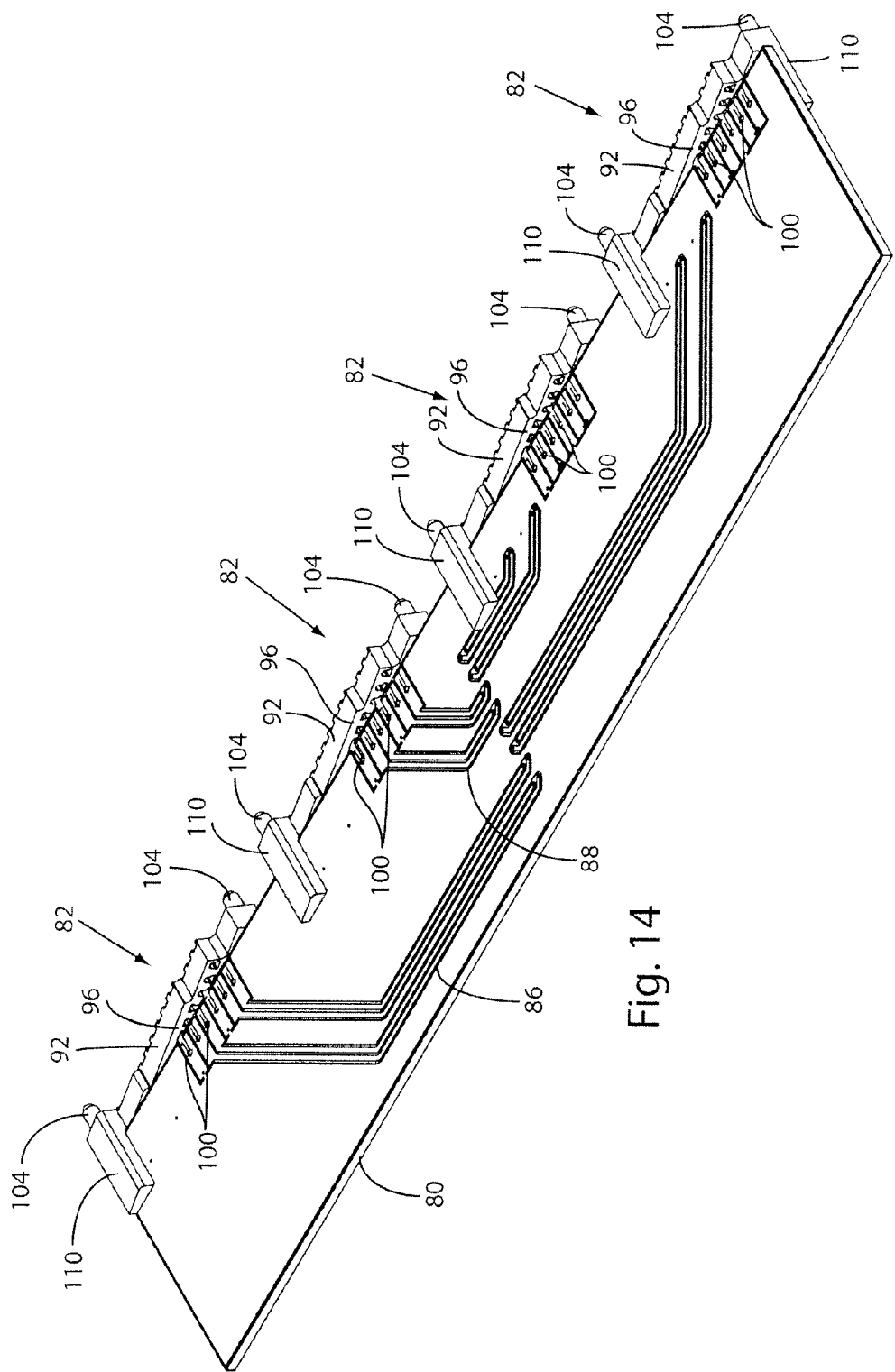
FIG. 14 is a perspective view of the backplane assembly, taken from above.
Figure 15:
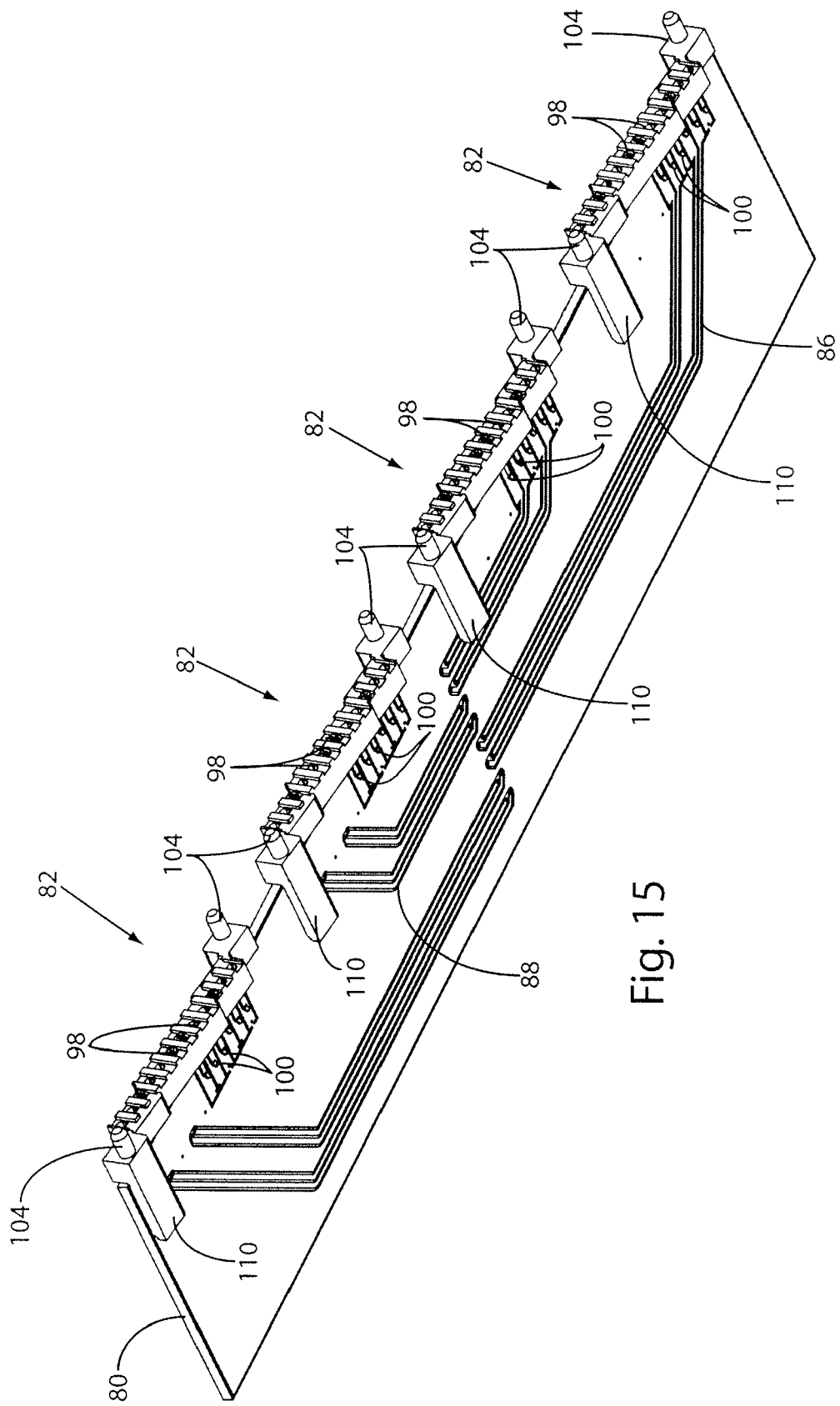
FIG. 15 is a perspective view of the parts shown in FIG. 14, taken from below.

Each adapter 82 also has a pair of pillars 110 which project from the housing 92 at opposite ends of the rear side 96. The pillars 110 face oppositely across the skewed line 103 to define a slot 111 for receiving the connector board 80 along the skewed line 103, as shown in FIG. 13. When the connector board 80 is received in the slot 111, the outer end portions 100 of the terminals 90 engage a set of contacts 84 on the connector board 80. As best seen from above and below in FIGS. 14 and 15, the outer end portions 100 of the terminals 90 on one side of the skewed line 103 engage contacts 84 on one side of the connector board 80, and the outer end portions 100 on the other side of the skewed line 103 engage contacts 84 on the other side of the connector board 80. The four adapters 82 are thus configured to receive the connector board 80 in an installed position extending diagonally across the rear side 28 of the backplane 12 to bridge the adapters 82, and thereby to electrically interconnect the four corresponding cards 14 at the front side 16, as shown in FIG. 13. In this manner the signal connections between the cards 14 are routed through the connector board assembly 30 instead of through the backplane 12.

Figure 16:
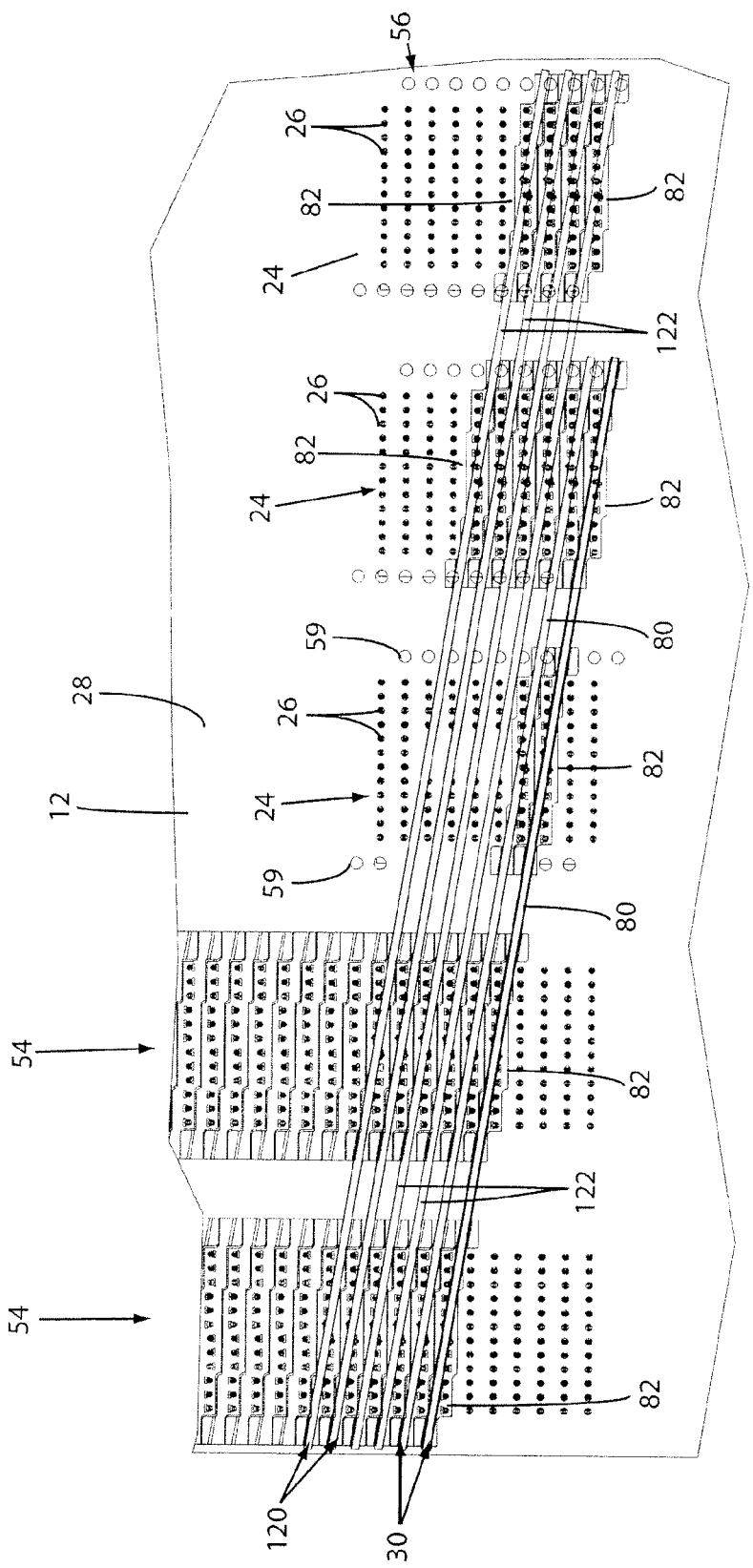
FIG. 16 is a rear perspective view showing additional parts of the backplane assembly.

Multiple connector board assemblies can be added as needed. For example, FIG. 16 shows the two hub cards 50 connected with the adjacent pair of daughter cards 52 by two of the connector board assemblies 30 described above. The hub cards 50 are connected to more remote pairs of daughter cards 52 by connector board assemblies 120 that differ only by having appropriately longer connector boards 122. Although each of these boards 80 and 122 has four sets of contacts 84 that are interconnected in two pairs for four corresponding arrays 24 of pins 26, the number and interconnected arrangement of contact sets can differ as required by any particular specification or standard of backplane routing assignments. The arrangement of conductor holes in a backplane can differ accordingly. In each case, the connector board is preferably perpendicular to the backplane, as in the embodiments shown in the drawings.

The patentable scope of the invention is defined by the claims, and may include other examples of how the invention can be made and used. Such other examples, which may be available either before or after the application filing date, are intended to be within the scope of the claims if they have structural or method elements that do not differ from the literal language of the claims, or if they have equivalent structural or method elements with insubstantial differences from the literal language of the claims.

What is claimed is:

1. An apparatus for electrically interconnecting conductors arranged at a rear side of a backplane in separate arrays corresponding to respective circuit boards at a front side of the backplane, the apparatus comprising:
    a board having signal routing circuitry;
    a plurality of first electrical terminals configured to engage a corresponding plurality of conductors in a first array along a first straight line; and
    a plurality of second electrical terminals configured to engage a corresponding plurality of conductors in a second array along a second straight line that is parallel but diagonally offset from the first straight line;
    wherein the first and second electrical terminals are further configured to engage the signal routing circuitry on the board when the board takes an installed position extending across the rear side of the backplane along a third straight line at an acute angle to the first and second straight lines to span a diagonal offset between the first and second electrical terminals and the corresponding conductors.

2. The apparatus of claim 1, wherein the board is configured to be perpendicular to the backplane when in the installed position.

3. The apparatus of claim 1, further comprising the backplane, and wherein the backplane is free of signal routing circuitry configured to interconnect the first and second arrays of conductors.

4. The apparatus of claim 1, wherein the acute angle is about 10 degrees.

5. The apparatus of claim 1, wherein the first electrical terminals are parts of a first adapter configured for mounting on the rear side of the backplane, and the second electrical terminals are parts of a second adapter configured for mounting on the rear side of the backplane separately from the first adapter.

6. The apparatus of claim 5, wherein the board is a structure separate from the adapters and has electrical contacts configured to engage the first and second electrical terminals on the adapters.

7. The apparatus of claim 1, wherein the conductors are pins.

8. An apparatus for electrically engaging conductors arranged at a rear side of a backplane in separate arrays corresponding to respective circuit boards at a front side of the backplane, the apparatus comprising:

a pair of adapters, each of which has a plurality of electrical terminals with inner and outer end portions, with the inner end portions arranged along a straight line to engage a corresponding row of conductors at the rear side of a backplane, and with the outer end portions arranged along a skewed line at an acute angle to the straight line to electrically engage a connector board installed at the rear side of a backplane in a position bridging the adapters along the skewed lines.

9. The apparatus of claim 8, wherein the adapters are configured for mounting on the rear side of a backplane separately from each other, with their straight lines extending along diagonally offset rows of conductors, and with their skewed lines extending together across multiple arrays of conductors.

10. The apparatus of claim 8, wherein each adapter has a slot for receiving an edge portion of a connector board along the respective skewed line.

11. The apparatus of claim 8, wherein each adapter is an elongated structure with a total of twelve electrical terminals.

12. The apparatus of claim 8, wherein the inner and outer end portions of the terminals at each adapter are arranged such that the skewed line lies in a plane parallel to the plane of the straight line.

13. An apparatus for electrically engaging conductors arranged at a rear side of a backplane in an array corresponding to a circuit board at a front side of the backplane, the apparatus comprising:

a plurality of electrical terminals with inner and outer end portions, with the inner end portions arranged along a straight line to engage a corresponding row of conductors at the rear side of the backplane, and with the outer end portions arranged along a skewed line at an acute angle to the straight line to electrically engage a connector board positioned at the acute angle to the row of conductors.

14. The apparatus of claim 13, wherein the outer end portions of the electrical terminals are arranged in rows on opposite sides of the skewed line so as to engage electrical contacts on opposite sides of a connector board.

15. The apparatus of claim 14, wherein the rows are equally spaced laterally across the skewed line.

16. The apparatus of claim 13, further comprising a support structure supporting the electrical terminals for mounting together at the rear side of the backplane.

17. The apparatus of claim 16, wherein the support structure has pegs receivable in peg holes in the backplane.

18. The apparatus of claim 16, wherein the support structure has a front side at which the inner end portions of the electrical terminals are arranged along the straight line, and has a rear side at which the outer end portions of the electrical terminals are arranged along the skewed line.

19. The apparatus of claim 18, wherein the electrical terminals project from the rear side of the support structure such that the outer end portions are spaced rearward from the rear side.

20. The apparatus of claim 18, wherein the inner end portions of the electrical terminals are accessible at the front side of the support structure but are not spaced forward from the front side.

21. The apparatus of claim 18, wherein the support structure comprises a housing having passages extending between the front and rear sides, and the electrical terminals are installed in the passages.

22. The apparatus of claim 18, wherein the support structure has portions projecting from the rear side on opposite sides of the skewed line to define a slot for receiving a connector board in electrical engagement with the outer end portions of the electrical terminals.

23. The apparatus of claim 9, wherein the inner and outer end portions of the terminals are arranged such that the skewed line lies in a plane parallel to the plane of the straight line.

* * * * *